(12) United States Patent
Shin et al.

(10) Patent No.: US 8,137,580 B2
(45) Date of Patent: Mar. 20, 2012

(54) CMP SLURRY COMPOSITION FOR FORMING METAL WIRING LINE

(75) Inventors: Dong-Mok Shin, Daejeon (KR); Eun-Mi Choi, Daejeon (KR); Seung-Beom Cho, Daejeon (KR); Hyun-Chul Ha, Daejeon (KR)

(73) Assignee: LG Chem, Ltd., Seoul (KR)

( * ) Notice: Subject to any disclaimer, the term of this patent is extended or adjusted under 35 U.S.C. 154(b) by 355 days.

(21) Appl. No.: 12/448,594

(22) PCT Filed: Dec. 28, 2007

(86) PCT No.: PCT/KR2007/006931
§ 371 (c)(1),
(2), (4) Date: Jun. 26, 2009

(87) PCT Pub. No.: WO2008/082177
PCT Pub. Date: Jul. 10, 2008

(65) Prior Publication Data
US 2010/0068883 A1    Mar. 18, 2010

(30) Foreign Application Priority Data
Dec. 29, 2006  (KR) .......... 10-2006-0137927

(51) Int. Cl.
*C09K 13/00* (2006.01)
(52) U.S. Cl. .......... 252/79.1; 252/79.2; 438/692

(58) Field of Classification Search .......... 438/692, 438/693; 252/79.1, 79.2; 216/88, 89
See application file for complete search history.

(56) References Cited

U.S. PATENT DOCUMENTS

| | | | |
|---|---|---|---|
| 6,048,256 A | 4/2000 | Obeng et al. | |
| 6,358,832 B1 * | 3/2002 | Edelstein et al. | 438/612 |
| 6,635,562 B2 | 10/2003 | Andreas | |
| 6,686,330 B2 | 2/2004 | Jordan, IV et al. | |
| 2001/0036795 A1 | 11/2001 | Merchant et al. | |
| 2004/0144755 A1 | 7/2004 | Motonari et al. | |
| 2005/0263407 A1 | 12/2005 | Brusic et al. | |
| 2006/0006074 A1 * | 1/2006 | Liu et al. | 205/640 |
| 2006/0175298 A1 * | 8/2006 | Zhao et al. | 216/88 |

FOREIGN PATENT DOCUMENTS

| | | |
|---|---|---|
| JP | 11-092749 | 4/1999 |
| JP | 2003-188121 | 7/2003 |
| JP | 2004-281848 | 10/2004 |
| WO | WO 02/083804 A1 | 10/2002 |

OTHER PUBLICATIONS

Database WPI Week 200472 Thomson Scientific, London, GB; AN 2004-731725, XP002612069.

* cited by examiner

*Primary Examiner* — Lan Vinh
(74) *Attorney, Agent, or Firm* — McKenna Long & Aldridge LLP

(57) ABSTRACT

Disclosed is CMP slurry, which includes a pyridine-based compound including at least two pyridinyl groups, and minimizes the occurrence of dishing and erosion of a wiring line.

15 Claims, 1 Drawing Sheet

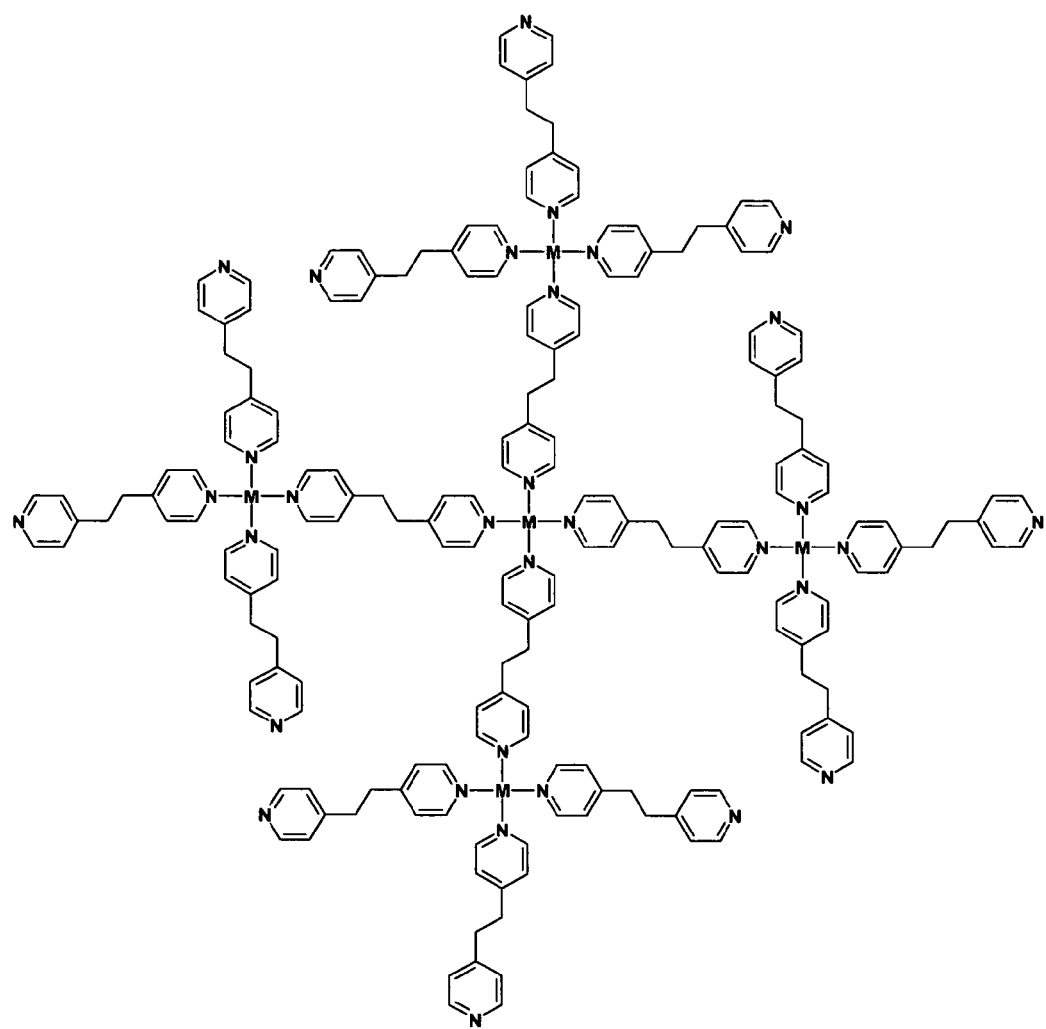

CMP SLURRY COMPOSITION FOR FORMING METAL WIRING LINE

This application is a 35 U.S.C. §371 National Stage entry of International Application No. PCT/KR2007/006931, filed on Dec. 28, 2007 and claims the benefit of Korean Patent Application No. 10-2006-0137927 filed on Dec. 29, 2006, both of which are incorporated herein by reference in its entirety.

TECHNICAL FIELD

The present invention relates to CMP slurry, and more particularly to CMP slurry which can minimize the occurrence of dishing, erosion, etc. of a wiring line without reducing a removing rate of a surplus amount of a wiring material (hereinafter, referred to as "a polishing rate").

BACKGROUND ART

In general, there has been a tendency to increase the diameter of a wafer in current semiconductor fabrication processes so as to accomplish high integration of a ULSI (ultralarge scale integrated circuit). Also, current semiconductor fabrication has been subjected to more strict standards including the minimum width requirement of 0.13 µm or less. Further, a step of forming a multiple interconnection or multilayer interconnection structure on a wafer is essentially required for improving the quality of a semiconductor device.

Therefore, a damascene process for forming a metal wiring line has been used. In the damascene process, a wiring line is formed by the steps of: forming grooves in a dielectric on a process wafer; embedding a wiring material, such as tungsten, aluminum or copper, etc., into the grooves; and removing a surplus amount of the wiring material.

One of method for removing a surplus amount of the wiring material is CMP (chemical mechanical polishing). During the process of CMP, a wafer surface is pressed against a polishing pad that rotates relative to the surface, and chemically reactive slurry is introduced into the polishing pad during the polishing process. Such a CMP technique accomplishes planarization of a wafer surface by way of chemical and physical actions.

However, in the above described polishing technique, there is a problem in that the wafer surface is polished unevenly (ex. dishing and erosion of a wiring line are occurred.), thereby reducing the reliability of a circuit. In order to solve such a problem, there has been provided a method of protecting a wiring line by using an appropriate corrosion inhibitor, but this method has a problem in that the polishing rate is significantly reduced.

BRIEF DESCRIPTION OF THE DRAWINGS

The foregoing and other objects, features and advantages of the present invention will become more apparent from the following detailed description when taken in conjunction with the accompanying drawings in which:

FIG. 1 is a view illustrating a coordination polymer that is expected to be formed on a metal surface according to the present invention, and herein, M represents a metal.

DISCLOSURE

Technical Problem

Therefore, the present invention has been made in view of the above-mentioned problems, and the present invention provides CMP slurry which can minimize the occurrence of dishing, erosion, etc. of a wiring line without reducing a polishing rate. More particularly, the present invention provides CMP slurry including a pyridine-based compound including at least two pyridinyl groups.

Also, the present invention provides an anti-adsorption agent for preventing a polishing residue from being adsorbed on a pad, based on the fact that when the CMP slurry including the pyridine-based compound is used, the adsorption of the polishing residue on a polishing pad is reduced during a polishing process.

Technical Solution

According to an aspect of the present invention, there is provided CMP slurry comprising an abrasive, an oxidant, a complexing agent, a corrosion inhibitor, and water, the corrosion inhibitor including a pyridine-based compound having at least two pyridinyl groups.

According to another aspect of the present invention, there is provided a chemical mechanical polishing (CMP) method, in which metal layers, oxide layers, dielectric layers or metal wiring line are planarized by using the CMP slurry.

According to a further aspect of the present invention, there is provided an anti-adsorption agent for preventing a polishing residue from being adsorbed on a pad during a CMP process, which includes a pyridine-based compound having at least two pyridinyl groups.

Hereinafter, the present invention will be explained in more detail.

CMP slurry for forming a wiring line generally includes an abrasive, an oxidant, a complexing agent, and water.

In general, a polishing process of removing a surplus amount of a wiring material by using the CMP slurry includes: a mechanical polishing in which the abrasive is physically rubbed against the surplus amount of the wiring material; and a chemical polishing in which the surplus amount of the wiring material is oxidized by the oxidant, and the complexing agent with the oxidized metal ions is formed into a complex, thereby removing the surplus amount of the wiring material.

However, in the above described polishing process, the occurrence of dishing, erosion, etc. of a wiring line may reduce the reliability of a circuit. A recessed area of an embedded wiring material, which is out of the range of a mechanical force because a polishing pad cannot reach the area, is mainly polished by a chemical mechanism. Herein, since it is difficult to control the amount of a wiring material to be removed, besides the surplus amount of the wiring material, an essential wiring material forming the wiring line may be polished. Accordingly, dishing, erosion, etc. of the wiring line, (such as depressions on the central surface of the wiring line) may occur. Especially, copper used for the wiring material, which is subject to corrosion, may easily cause the above described problem.

Therefore, there has been provided a method of adding a corrosion inhibitor (for example, Benzotriazole (BTA)) to CMP slurry, so that the corrosion inhibitor can be physically adsorbed to the surface of an wiring material, and can protect a wiring line. However, the conventional corrosion inhibitor inhibits chemical/mechanical polishing of a projected area of an embedded wiring material as well as a recessed area of the embedded wiring material, thereby reducing a polishing rate.

The present invention provides CMP slurry which comprises a pyridine-based compound having at least two pyridinyl groups, as a corrosion inhibitor, and can minimize the occurrence of dishing, erosion, etc. of a wiring line without reducing a polishing rate.

Hereinafter, the action mechanism of the pyridine-based compound will be described. However, the following examples are illustrative only, and the scope of the present invention is not limited thereto.

A pyridine-based compound is coordinated to a metal ion which is ionized by an oxidant, and thus is formed into a two-dimensional coordination polymer as shown in FIG. 1. The coordination polymer is physically adsorbed to the surface of a wiring material, and thus prevents the chemical action of an oxidant or a complexing agent on a wiring line, thereby preventing chemical polishing on the wiring line.

In the coordination polymer, a coordinate bond between a nitrogen atom of a pyridinyl group and a metal ion is very weak, and also is weaker than a bond between a conventional corrosion inhibitor (BTA) and a metal ion. Therefore, in a polishing process, when physical force is added to a projected area of an embedded wiring material by an abrasive, the coordinate bond between a nitrogen atom of a pyridinyl group and a metal ion may be easily broken. Herein, the projected area of the exposed surface of the wiring material is polished by chemical/mechanical polishing, so that a surplus amount of the wiring material can be removed.

In other words, in the present invention, since a recessed area of an embedded wiring material is not polished while a projected area is sufficiently polished, it is possible to protect a wiring line. Therefore, in the present invention, it is possible to minimize the occurrence of dishing, erosion, etc. of a wiring line without reducing a polishing rate.

A pyridine-based compound according to the present invention is not particularly limited as long as the compound has at least two pyridinyl groups. Also, in the pyridine-based compound, at least two pyridinyl groups may be bonded to each other in a direct way or via a hydrocarbon group. Herein, it is preferable that the hydrocarbon group is an alkylene or alkenylene group having 5 or less carbons. In the case of a hydrocarbon group having 6 or more carbons, the pyridine-based compound cannot be sufficiently dissolved in water, and thus may be difficult to be used for CMP slurry. Also, in order to improve the solubility of the pyridine-based compound in water, the pyridinyl group may be substituted with OH or COOH.

A pyridine-based compound according to the present invention may be represented by Formulas 1 and 2, and non-limiting examples of the pyridine-based compound include 2,2'-dipyridylethane (2,2'-DPEA), 2,2'-dipyridylethene (2,2'-DPEE), 2,2'-dipyridylpropane, 2,2'-dipyridyl (2,2'-DP), 3,3'-dipyridylethane (3,3'-DPEA), 3,3'-dipyridylethene (3,3'-DPEE), 3,3'-dipyridylpropane, 3,3'-dipyridyl (3,3'-DP), 3,4'-dipyridylethane (3,4'-DPEA), 3,4'-dipyridylethene (3,4'-DPEE), 3,4'-dipyridylpropane, 3,4'-dipyridyl (3,4'-DP), 4,4'-dipyridylethane (4,4'-DPEA), 4,4'-dipyridylethene (4,4'-DPEE), 4,4'-dipyridylpropane, 4,4'-dipyridyl (4,4'-DP), etc.

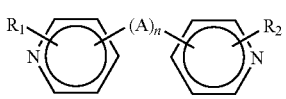

[Formula 1]

In formula 1, n represents an integer 0 or 1; A represents $C_1$~$C_5$ alkylene or $C_2$~$C_5$ alkenylene; and each of $R_1$ and $R_2$ independently represents H, OH, or $CO_2H$.

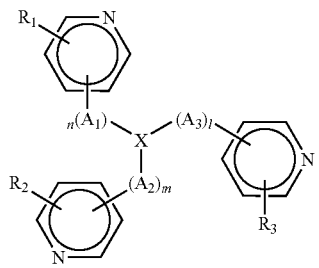

[Formula 2]

In formula 2, X represents CH or N; each of $A_1$, $A_2$, and $A_3$ independently represents NH, $C_1$~$C_5$ alkylene or $C_2$~$C_5$ alkenylene; each of n, m, and l independently represents an integer 0 or 1, and herein, at least two of n, m, and l are 1; and each of $R_1$, $R_2$, and $R_3$ independently represents H, OH, or $CO_2H$.

Also, the pyridine-based compound is used in an amount of 0.001~3 wt %, and preferably of 0.01~2 wt % based on the total weight of the slurry. If the amount of the pyridine-based compound is less than 0.001 wt %, it is not possible to sufficiently inhibit the corrosion, resulting in the occurrence of dishing and erosion of a wiring line. If the amount of the pyridine-based compound is greater than 3 wt %, the resultant slurry shows low dispersion stability. Accordingly, the corrosion may locally occur.

The CMP slurry according to the present invention includes the same components (that is, an abrasive, an oxidant, a complexing agent, and water), except the pyridine-based compound, as those included in the conventional CMP slurry known to one skilled in the art.

According to a preferred embodiment of the present invention, the abrasive particles include metal oxides, organic particles or organic-inorganic composite particles. As the metal oxide particle, at least one particle selected from the group consisting of silica ($SiO_2$), alumina ($Al_2O_3$), ceria ($CeO_2$), zirconia ($ZrO_2$), titania (titanium dioxide) and zeolite may be used, and silica is preferred. Such metal oxide particles may be obtained via any one process of a fuming process and a sol-gel process.

As the organic particle, at least one particle may be selected from the group including (i) polymers such as polystyrene, styrene copolymer, poly(meth)acrylate, (meth)acrylate based copolymer, polyvinyl chloride, polyamide, polycarbonate, polyimide, etc.; or comprise (ii) core/shell structure particles in which at least one kind of polymer selected from the group (i) is included in the core or/and the shell. Particularly, polystyrene is preferred. Also, such materials may be used alone or in combination, and the organic particle may be obtained via emulsion polymerization, suspension polymerization, etc.

Meanwhile, when metal oxides is used as an abrasive, primary particles of such metal oxides preferably have a size of 10~200 nm, and more preferably 20~100 nm. Also, in the case that organic particles are used, primary particles of such organic particles preferably have a size of 10~500 nm, and more preferably 50~300 nm. If the abrasive particles are too small, the polishing rate decreases. If the abrasive particles are too large, dispersion stability decreases.

The abrasive is used in an amount of 0.1~30 wt %, and preferably of 0.5~10 wt % based on the total weight of the slurry. If the amount of the abrasive is less than 0.1 wt %, it is not possible to perform polishing sufficiently. If the amount of the abrasive is greater than 30 wt %, the resultant slurry shows low stability.

The oxidant according to the present invention oxidizes a wiring material to form an oxide layer, and may include a conventional oxidant known to one skilled in the art. Non-limiting examples of the oxidant include hydrogen peroxide, organic peroxide, ammonium persulfate (APS), potassium persulfate (KPS), hypochlorous acid (HOCl), potassium permanganate, ferric nitrate, potassium ferricyanide, potassium periodinate, sodium hyperchlorite (NaOCl), vanadium trioxide, potassium bromate (KBrO3), or the like. Non-limiting examples of the organic peroxide include peracetic acid, perbenzoic acid, t-butylhydroperoxide, or the like. Such oxidants may be used alone or in combination, and hydrogen peroxide is particularly preferred.

The oxidant is used in an amount of 0.1~10 wt %, and preferably of 0.1~5 wt %, based on the total weight of the slurry. If the amount of the oxidant is greater than 10 wt %, excessive surface corrosion or local corrosion occurs. If the amount of the oxidant is less than 0.1 wt %, the polishing rate decreases significantly.

In order to remove the oxidized metal ions as well as to increase the polishing rate, the CMP slurry according to the present invention includes a complexing agent. In general, the complexing agent shares ligands having electron pairs with the metal ions and forms a complex which has chemically stable structure. Accordingly, metal ions cannot be easily redeposited onto a metal surface.

There is no particular limitation in a complexing agent, and the complexing agent may include an amino acid compound, an amine compound, or a carboxylic acid compound. Non-limiting examples of the amino acid compound, the amine compound, or the carboxylic acid compound include alanine, glycine, cystine, histidine, asparagine, guanidine, tryptophan, 1,2-diaminocyclohexane, diaminoproprionic acid, hydrazine, ethylenediamine, 1,2-diaminopropane, 1,3-diaminopropane, diaminopropanol, acetic acid, lactic acid, ascorbic acid, quinaldic acid, pyridinecarboxylic acid, and salts thereof.

Also, a carboxylic acid compound having at least two carboxyl groups may be used as the complexing agent. Non-limiting examples of such carboxylic acid compound include maleic acid, malic acid, tartaric acid, malonic acid, phthalate, oxalic acid, 2,3-pyridinedicarboxylic acid, aspartic acid, N-acetylaspartic acid, adipic acid, 3,5-pyrazoledicarboxylic acid, citric acid, nitrotriacetic acid, ethylenediaminetetraacetic acid (EDTA), and salts thereof.

Such example of complexing agent may be used alone or in combination.

Meanwhile, the complexing agent is used in an amount of 0.05~5 wt %, and preferably of 0.1~2 wt % based on the total weight of the slurry. If the amount of the complexing agent is greater than 2 wt %, excessive surface corrosion occurs and WIWNU (Within Wafer Non-Uniformity) is significantly deteriorated. If the amount of the complexing agent is less than 0.05 wt %, it is not possible to obtain a desired effect.

Meanwhile, the CMP slurry according to the present invention may further comprise a pH modifier to adjust the pH to an applicable range. Non-limiting examples of the pH modifier include: basic modifiers, such as potassium hydroxide, sodium hydroxide, aqueous ammonia, rubidium hydroxide, cesium hydroxide, sodium hydrogen carbonate, etc.; and acidic modifiers, such as hydrofluoric acid, hydrochloric acid, nitric acid, sulfuric acid, phosphoric acid, formic acid, acetic acid, etc. When using a strong acid or strong base, particle agglomeration may occur in the slurry due to a local pH change. Thus, such strong acids or bases are used preferably after diluting them with deionized water.

Herein, the pH modifier is preferably used in such a manner that the CMP slurry according to the present invention has a pH of 3~11. CMP slurry having a pH of less than 3 or greater than 11 may adversely affect the removal rate and selectivity.

Also, the present invention provides a chemical mechanical polishing (CMP) method using the CMP slurry according to the present invention for carrying out planarization of metal layers, oxide layers, dielectric layers or metal wiring line.

Also, the present invention provides an anti-adsorption agent for preventing a polishing residue from being adsorbed on a pad during a CMP process, which includes a pyridine-based compound having at least two pyridinyl groups.

In forming a wiring line by using a damascene method, a surplus amount of a wiring material removed by chemical/mechanical polishing (hereinafter, referred to as "the polishing residue") may remain in slurry during a polishing process, and thus may adsorb and agglomerate on a polishing pad surface. Accordingly, a polishing rate may be decreased, and a scratch may occur on a wafer surface.

Therefore, in order to remove the polishing residue adsorbed on a polishing pad, a method of trimming the pad surface by a conditioner has been used. However, when both a conditioning process and a polishing process are performed at the same time, foam caused by the conditioning process may inhibit the polishing process. Also, when the conditioning process is performed before or after the polishing process, the polishing residue is continuously adsorbed on the polishing pad during the polishing process, thereby reducing polishing quality.

The present inventors found that CMP slurry including a pyridine-based compound having at least two pyridinyl groups may prevent a polishing residue from being adsorbed on a polishing pad during a polishing process. Based on this point, the present invention provides a pyridine-based compound as an anti-adsorption agent of the polishing residue.

It is preferable that a complexing agent which is used in combination with the above described anti-adsorption agent is a carboxylic acid having at least two carboxyl groups. When a carboxylic acid compound having at least two carboxyl groups is used as a complexing agent, the polishing residue is easily adsorbed on a polishing pad. Therefore, when the above carboxylic acid is used in combination with the pyridine-based compound according to the present invention, it is possible to more efficiently achieve pad anti-adsorption prevention effect.

Mode for the Invention

Reference will now be made in detail to the preferred embodiments of the present invention. It is to be understood that the following examples are illustrative only and the present invention is not limited thereto.

Polystyrene (PS) used in the following Examples was prepared by emulsion polymerization (average particle size: 80 nm), and silica used in the following Examples is commercially available from Fuso Chemical Co., Ltd., as the trade name of PL-3L (primary particle diameter: 35 nm) of the Quartron PL series.

Experimental Example 1

Determination of Etching Rate

Example 1

To a polypropylene bottle, 2 wt % of polystyrene (PS), 1 wt % of hydrogen peroxide, 0.5 wt % of glycine, and 0.2 wt % of 4,4'-dipyridylethane (4,4'-DPEA) were introduced. Next, deionized water was added to the mixture so as to adjust to 100 wt % of the combined weight thereof and 2.8 of the pH thereof. And the mixture was agitated for 10 minutes under a high speed to manufacture a CMP slurry.

2×2 cm² pieces of a copper (Cu) wafer on which a Cu layer is deposited to 1500 nm via PVD (Physical Vapor Deposition) were immersed in 30 ml of the obtained CMP slurry for 30 minutes. Then, the changed weight of the wafer was measured to determine the etching rate of Cu. Table 1 shows the results.

Examples 2~11

As noted in Table 1, CMP slurry was obtained in the same manner as described in Example 1, except that a different abrasive, a different complexing agent, a different corrosion inhibitor, and different pH were employed, and then the etching rate of Cu was determined. Table 1 shows the results.

Comparative Examples 1~11

As noted in Table 2, CMP slurry was obtained in the same manner as described in Example 1, except that a different abrasive, a different complexing agent, a different corrosion inhibitor, and different pH were employed, and then the etching rate of Cu was determined. Table 2 shows the results.

TABLE 1

| | Exp. | | | | | |
|---|---|---|---|---|---|---|
| | 1 | 2 | 3 | 4 | 5 | 6 |
| Abrasive (wt %) | PS (2) | PS (2) | PS (2) | PS (2) | PS (2) | PS (2) |
| Oxidant (wt %) | $H_2O_2$ (1) | $H_2O_2$ (1) | $H_2O_2$ (1) | $H_2O_2$ (1) | $H_2O_2$ (1) | $H_2O_2$ (1) |
| Complexing agent (wt %) | Glycine (0.5) | Glycine (0.5) | Glycine (0.5) | Glycine (0.5) | Glycine (0.5) | Glycine (0.5) |
| Corrosion inhibitor (wt %) | 4,4'-DPEA (0.2) | 4,4'-DPEA (0.2) | 4,4'-DPEA (0.2) | 4,4'-DPEA (0.2) | 4,4'-DPEE (0.2) | 4,4'-DPEE (0.2) |
| pH | 2.8 | 4.2 | 6.3 | 9.0 | 3.3 | 5.6 |
| Etching rate (Å/min) | <10 | <10 | <10 | <10 | 75 | 85 |

| | Exp. | | | | |
|---|---|---|---|---|---|
| | 7 | 8 | 9 | 10 | 11 |
| Abrasive (wt %) | PL3L (2) | PL3L (2) | PL3L (2) | PL3L (2) | PL3L (2) |
| Oxidant (wt %) | $H_2O_2$ (1) | $H_2O_2$ (1) | $H_2O_2$ (1) | $H_2O_2$ (1) | $H_2O_2$ (1) |
| Complexing agent (wt %) | Glycine (0.5) | Hydrazine (0.5) | Hydrazine (0.5) | Hydrazine (0.5) | Hydrazine (0.5) |
| Corrosion inhibitor (wt %) | 4,4'-DP (0.2) | 4,4'-DP (0.2) | 4,4'-DP (0.2) | 4,4'-DP (0.2) | 4,4'-DP (0.2) |
| pH | 2.9 | 2.8 | 4.6 | 6.9 | 9.2 |
| Etching rate (Å/min) | 15 | 44 | 18 | 14 | <10 |

4,4'-DPEA: 4,4'-dipyridylethane
4,4'-DPEE: 4,4'-dipyridylethene
4,4'-DP: 4,4'-dipyridyl

TABLE 2

| | Comp. Exp. | | | | | |
|---|---|---|---|---|---|---|
| | 1 | 2 | 3 | 4 | 5 | 6 |
| Abrasive (wt %) | PL3L (2) | PL3L (2) | PS (2) | PL3L (2) | PL3L (2) | PL3L (2) |
| Oxidant (wt %) | $H_2O_2$ (1) | $H_2O_2$ (1) | $H_2O_2$ (1) | $H_2O_2$ (1) | $H_2O_2$ (1) | $H_2O_2$ (1) |
| Complexing agent (wt %) | Glycine (0.5) | Glycine (0.5) | Glycine (0.5) | Glycine (0.5) | Glycine (0.5) | Glycine (0.5) |
| Corrosion inhibitor (wt %) | — | — | — | BTA (0.2) | BTA (0.2) | Pyridne (0.2) |
| pH | 3.0 | 6.1 | 9.1 | 3.2 | 9.0 | 3.8 |
| Etching rate (Å/min) | 260 | 247 | 163 | <10 | <10 | 358 |

| | Comp. Exp. | | | | |
|---|---|---|---|---|---|
| | 7 | 8 | 9 | 10 | 11 |
| Abrasive (wt %) | PL3L (2) | PL3L (2) | PL3L (2) | PL3L (2) | PL3L (2) |
| Oxidant (wt %) | $H_2O_2$ (1) | $H_2O_2$ (1) | $H_2O_2$ (1) | $H_2O_2$ (1) | $H_2O_2$ (1) |

TABLE 2-continued

| Complexing agent (wt %) | Glycine (0.5) | Glycine (0.5) | Hydrazine (0.5) | Hydrazine (0.5) | Hydrazine (0.5) |
|---|---|---|---|---|---|
| Corrosion inhibitor (wt %) | Pyridne (0.2) | Pyridne (0.2) | — | — | — |
| pH | 7.3 | 9.5 | 3.3 | 5.6 | 7.8 |
| Etching rate (Å/min) | 214 | 213 | 336 | 417 | 224 |

As noted in Tables 1 and 2, compared to CMP slurry obtained by each of Comparative Examples 1~3 and 9~11 in which a pyridine-based compound was not used as a corrosion inhibitor, and an abrasive, a complexing agent, or pH was changed, CMP slurry obtained by each of Examples 1~11, in which a pyridine-based compound (4,4'-DPEA, 4,4'-DPEE, 4,4'-DP) having at least two pyridinyl groups was used as a corrosion inhibitor, shows a significantly decreased etching rate of Cu. Therefore, it is determined that the pyridine-based compound according to the present invention can inhibit the corrosion of Cu, free from influence of other components of CMP slurry.

Especially, CMP slurry obtained by each of Examples 1~3, 7, and 9~11 according to the present invention shows the etching rate of Cu at a similar level to CMP slurry obtained by each of Comparative Examples 4 and 5 in which BTA (conventionally known to one skilled in the art) was used as a corrosion inhibitor. Therefore, it is determined that a corrosion inhibiting effect of a pyridine-based compound according to the present invention is similar to that of a conventional corrosion inhibitor.

Meanwhile, CMP slurry obtained by each of Comparative Examples 6~8, in which a compound having one pyridinyl group (pyridine) was used as a corrosion inhibitor, shows the etching rate of Cu at a similar level to CMP slurry obtained by each of Comparative Examples 1~3 and 9~11 in which no corrosion inhibitor was used. Therefore, it is determined that such a compound having only one pyridinyl group is not effective in corrosion inhibition, and thus is not appropriate as a corrosion inhibitor of CMP slurry.

Experimental Example 2

Determination of Polishing Rate

Example 12

To a polypropylene bottle, 2 wt % of polystyrene (PS), 1 wt % of hydrogen peroxide, 0.5 wt % of glycine, and 0.2 wt % of 4,4'-dipyridylethane (4,4'-DPEA) were introduced. Next, deionized water was added to the mixture so as to adjust to 100 wt % of the combined weight thereof and 9.0 of the pH thereof. And the mixture was agitated for 10 minutes under a high speed to manufacture a CMP slurry.

The resultant CMP slurry was used for polishing for 1 minute under the following conditions. The removal rate was determined by measuring the variation in the thickness before and after polishing. The results are shown in the following Table 3.

[Polishing Conditions]
Polishing system: CDP 1CM51 (Logitech Co.)
Polishing pad: IC1000/SubaIV Stacked (Rodel Co.)
Platen speed: 75 rpm
Carrier speed: 75 rpm
Pressure: 3 psi
Slurry flow rate: 200 ml/min.
[Objects to be Polished]
A 6-inch copper (Cu) wafer on which a Cu layer is deposited to 15,000 Å via PVD (physical vapor deposition)
[Evaluation]
The thickness of each metal layer was measured by using LEI1510 Rs Mapping system (LEI Co.) from the surface resistance of each layer according to the following formula:

$$[\text{Cu layer thickness (Å)}] = [\text{Cu layer resistivity }(\Omega/\text{cm})/\text{sheet resistivity }(\Omega/\text{square}(\square))] \times 10^8$$

Examples 13~14

As noted in Table 3, CMP slurry was obtained in the same manner as described in Example 12, except that a different abrasive and a different corrosion inhibitor were employed, and then the polishing rate was determined. Table 3 shows the results.

Comparative Examples 12~16

As noted in Table 4, CMP slurry was obtained in the same manner as described in Example 12, except that a different abrasive and a different corrosion inhibitor were employed, and then the polishing rate was determined. Table 4 shows the results.

TABLE 3

| Exp. | 12 | 13 | 14 |
|---|---|---|---|
| Abrasive (wt %) | PS (2) | PS (2) | PL-3L (2) |
| Oxidant (wt %) | $H_2O_2$ (1) | $H_2O_2$ (1) | $H_2O_2$ (1) |
| Complexing agent (wt %) | Glycine (0.5) | Glycine (0.5) | Glycine (0.5) |
| Corrosion inhibitor (wt %) | 4,4'-DPEA (0.2) | 4,4'-DP (0.2) | 4,4'-DPEA (0.2) |
| pH | 9.0 | 9.0 | 9.0 |
| Polishing rate (Å/min) | 3392 | 3151 | 2937 |

TABLE 4

| Comp. Exp. | 12 | 13 | 14 | 15 |
|---|---|---|---|---|
| Abrasive (wt %) | PS (2) | PL-3L (2) | PS (2) | PL-3L (2) |
| Oxidant (wt %) | $H_2O_2$ (1) | $H_2O_2$ (1) | $H_2O_2$ (1) | $H_2O_2$ (1) |
| Complexing agent (wt %) | Glycine (0.5) | Glycine (0.5) | Glycine (0.5) | Glycine (0.5) |
| Corrosion inhibitor (wt %) | — | — | BTA-COOH (0.2) | BTA (0.1) |

TABLE 4-continued

| Comp. Exp. | 12 | 13 | 14 | 15 |
|---|---|---|---|---|
| pH | 9.0 | 9.0 | 9.5 | 9.0 |
| Polishing rate (Å/min) | 3063 | 2879 | 1202 | 24 |

* BTA-COOH: Benzotriazole-5-carboxylic acid

As noted in Tables 3 and 4, compared to CMP slurry obtained by each of Comparative Examples 12 and 13 in which no corrosion inhibitor was used, CMP slurry obtained by each of Comparative Examples 14 and 15 in which BTA-COOH and BTA (conventionally known to one skilled in the art) were used as a corrosion inhibitor shows a significantly decreased polishing rate.

On the other hand, compared to CMP slurry obtained by each of Comparative Examples 12 and 13 in which no corrosion inhibitor was used, CMP slurry obtained by each of Examples 12~14, in which a pyridine-based compound having at least two pyridinyl groups (4,4'-DPEA, 4,4'-DPEE, 4,4'-DP) was used as a corrosion inhibitor, shows an improved polishing rate.

Based on the results in Tables 1~4, it is determined that when a pyridine-based compound having at least two pyridinyl groups is used as a corrosion inhibitor of CMP slurry, it is possible to minimize the occurrence of dishing and erosion of a wiring line without reducing a polishing rate.

Experimental Example 3

Determination of Adsorption on a Polishing Pad

Example 15

To a polypropylene bottle, 5 wt % of silica, 0.1 wt % of hydrogen peroxide, 1 wt % of oxalic acid, and 0.1 wt % of 4,4'-dipyridylethane (4,4'-DPEA) were introduced. Next, deionized water was added to the mixture so as to adjust to 100 wt % of the combined weight thereof and 9.3 of the pH thereof. And the mixture was agitated for 10 minutes under a high speed to manufacture a CMP slurry.

The obtained CMP slurry was used for a polishing process for 1 minute under the same conditions as described in Experimental Example 2. Then, the adsorption of a polishing residue on a polishing pad surface was observed. Table 5 shows the results.

Examples 16~17

As noted in Table 5, CMP slurry was obtained in the same manner as described in Example 15, except that a different corrosion inhibitor was used, and then the adsorption of a polishing residue on a polishing pad surface was observed. Table 5 shows the results.

Comparative Examples 16~18

As noted in Table 5, CMP slurry was obtained in the same manner as described in Example 15, except that a different corrosion inhibitor was used, and then the adsorption of a polishing residue on a polishing pad surface was observed. Table 5 shows the results.

TABLE 5

| | Exp. 15 | Exp. 16 | Exp. 17 | Comp. Exp. 16 | Comp. Exp. 17 | Comp. Exp. 18 |
|---|---|---|---|---|---|---|
| Abrasive (wt %) | Silica (5) | Silica (5) | Silica (5) | Silica (5) | Silica (5) | Silica (5) |
| Oxidant (wt %) | $H_2O_2$ (0.1) | $H_2O_2$ (0.1) | $H_2O_2$ (0.1) | $H_2O_2$ (0.1) | $H_2O_2$ (0.1) | $H_2O_2$ (0.1) |
| Complexing agent (wt %) | Oxalic acid (1) | Oxalic acid (1) | Adipic acid (1) | Oxalic acid (1) | Oxalic acid (1) | Adipic acid (1) |
| Additive (wt %) | 4,4'-DPEA (0.1) | 4,4'-DPPA (0.1) | 4,4'-DPEA (0.1) | QA (0.1) | — | — |
| pH | 9.3 | 9.3 | 9.3 | 9.3 | 9.3 | 9.3 |
| Adsorption on pad | no | no | no | yes | yes | yes |

4,4'-DPPA: 1,3-bis(4-pyridyl)propane
QA: quinaldic acid

Based on the results of the above described Examples, it is determined that when a pyridine-based compound having at least two pyridinyl groups is used for CMP slurry, it is possible to inhibit the adsorption of a polishing residue on a polishing pad during a polishing process.

INDUSTRIAL APPLICABILITY

CMP slurry according to the present invention can minimize the occurrence of dishing and erosion of a wiring line without reducing a polishing rate, thereby improving economical efficiency and reliability of a circuit.

While this invention has been described in connection with what is presently considered to be the most practical and exemplary embodiment, it is to be understood that the invention is not limited to the disclosed embodiment and the drawings, but, on the contrary, it is intended to cover various modifications and variations within the spirit and scope of the appended claims.

The invention claimed is:

1. CMP slurry comprising an abrasive, an oxidant, a complexing agent, a pyridine-based compound represented by Formula 1 or Formula 2, and water,

[Formula 1]

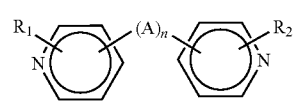

wherein n is 1; A represents $C_1$~$C_5$ alkylene or $C_2$~$C_5$ alkenylene; and each of $R_1$ and $R_2$ independently represents H, OH, or $CO_2H$;

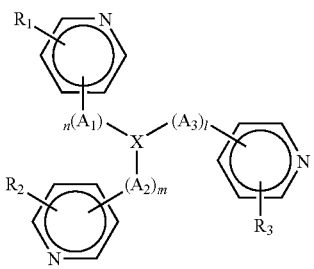

[Formula 2]

wherein X represents CH or N; each of $A_1$, $A_2$, and $A_3$ independently represents NH, $C_1$~$C_5$ alkylene or $C_2$~$C_5$ alkenylene; each of n, m, and l independently represents an integer 0 or 1, and herein, at least two of n, m, and l are 1; and each of $R_1$, $R_2$, and $R_3$ independently represents H, OH, or $CO_2H$.

2. The CMP slurry as claimed in claim 1, wherein the pyridine-based compound can be physically adsorbed on a metal layer surface, or can form a chemical bond with a metal or a metal ion.

3. The CMP slurry as claimed in claim 1, wherein the pyridine-based compound is selected from the group including 2,2'-dipyridylethane (2,2'-DPEA), 2,2'-dipyridylethene (2,2'-DPEE), 2,2'-dipyridylpropane, 3,3'-dipyridylethane (3,3'-DPEA), 3,3'-dipyridylethene (3,3'-DPEE), 3,3'-dipyridylpropane, 3,4'-dipyridylethane (3,4'-DPEA), 3,4'-dipyridylethene (3,4'-DPEE), 3,4'-dipyridylpropane, 4,4'-dipyridylethane (4,4'-DPEA), 4,4'-dipyridylethene (4,4'-DPEE), and 4,4'-dipyridylpropane.

4. The CMP slurry as claimed in claim 1, wherein the oxidant is selected from the group including hydrogen peroxide, ammonium persulfate (APS), potassium persulfate (KPS), hypochlorous acid (HOCl), potassium dichromate, potassium permanganate, ferric nitrate, potassium ferricyanide, potassium periodate, sodium hyperchlorite (NaOCl), vanadium trioxide, potassium bromate ($KBrO_3$), peracetic acid, perbenzoic acid, and tert-butyl hydroperoxide.

5. The CMP slurry as claimed in claim 1, wherein the complexing agent is selected from the group including an amino acid-based compound, an amine-based compound, and a carboxylic acid-based compound.

6. The CMP slurry as claimed in claim 1, wherein the complexing agent is selected from the group including alanine, glycine, cystine, histidine, asparagine, guanidine, tryptophan, 1,2-diaminocyclohexane, diaminopropionic acid, hydrazine, ethylenediamine, 1,2-diaminopropane, 1,3-diaminopropane, diaminopropanol, acetic acid, lactic acid, ascorbic acid, quinaldic acid, pyridinecarboxylic acid, and salts thereof.

7. The CMP slurry as claimed in claim 1, wherein the complexing agent is a carboxylic acid compound having at least two carboxyl groups.

8. The CMP slurry as claimed in claim 1, wherein the complexing agent is selected from the group including maleic acid, malic acid, tartaric acid, malonic acid, phthalate, oxalic acid, 2,3-pyridinecarboxylic acid, aspartic acid, N-acetylaspartic acid, adipic acid, 3,5-pyrazoldicarboxylic acid, citric acid, nitrotriacetic acid, ethylenediaminetetraacetic acid, and salts thereof.

9. The CMP slurry as claimed in claim 1, which comprises: 0.1~30 wt % of abrasive particles; 0.1~10 wt % of an oxidant; 0.05~5 wt % of a complexing agent; 0.001~3 wt % of the pyridine-based compound; and the balance amount of water, based on 100 wt % of the total slurry.

10. The CMP slurry as claimed in claim 1, wherein the CMP slurry is for forming a copper wiring line.

11. The CMP slurry as claimed in claim 1, wherein the abrasive is selected from the group including metal oxides, organic particles and organic-inorganic composite particles.

12. The CMP slurry as claimed in claim 11, wherein the metal oxide is selected from the group including silica ($SiO_2$), alumina ($Al_2O_3$), ceria ($CeO_2$), zirconia ($ZrO_2$), titania (titanium dioxide), and zeolite.

13. The CMP slurry as claimed in claim 11, wherein the organic particle is selected from (i) the group including polystyrene, styrene copolymer, poly(meth)acrylate, (meth)acrylate based copolymer, polyvinyl chloride, polyamide, polycarbonate, and polyimide; or comprises (ii) core/shell structure particles in which at least one kind of polymer selected from the group (i) is included in the core or/and the shell.

14. The CMP slurry as claimed in claim 11, wherein primary particles of the metal oxides have a size of 10~200 nm, and primary particles of the organic particles have a size of 10~500 nm.

15. A chemical mechanical polishing (CMP) method, in which metal layers, oxide layers, dielectric layers or metal wiring line are planarized by using CMP slurry as claimed in claim 1, which comprises an abrasive, an oxidant, a complexing agent, a pyridine-based compound represented by Formula 1 or Formula 2, and water,

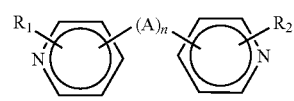

[Formula 1]

wherein n is 1; A represents $C_1$~$C_5$ alkylene or $C_2$~$C_5$ alkenylene; and each of $R_1$ and $R_2$ independently represents H, OH, or $CO_2H$;

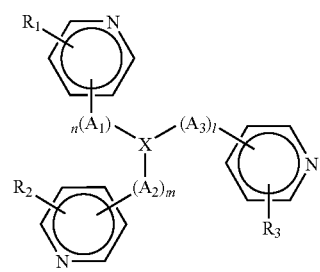

[Formula 2]

wherein X represents CH or N; each of $A_1$, $A_2$, and $A_3$ independently represents NH, $C_1$~$C_5$ alkylene or $C_2$~$C_5$ alkenylene; each of n, m, and l independently represents an integer 0 or 1, and herein, at least two of n, m, and l are 1; and each of $R_1$, $R_2$, and $R_3$ independently represents H, OH, or $CO_2H$.

* * * * *